United States Patent
Bravo et al.

(10) Patent No.: US 9,601,319 B1
(45) Date of Patent: Mar. 21, 2017

(54) SYSTEMS AND METHODS FOR ELIMINATING FLOURINE RESIDUE IN A SUBSTRATE PROCESSING CHAMBER USING A PLASMA-BASED PROCESS

(71) Applicant: Lam Research Corporation, Fremont, CA (US)

(72) Inventors: Andrew Stratton Bravo, San Mateo, CA (US); Joydeep Guha, Danville, CA (US); Amit Pharkya, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/990,320

(22) Filed: Jan. 7, 2016

(51) Int. Cl.
| | |
|---|---|
| B08B 7/00 | (2006.01) |
| H01J 37/32 | (2006.01) |
| H01L 21/67 | (2006.01) |
| C23C 16/44 | (2006.01) |

(52) U.S. Cl.
CPC .......... *H01J 37/32862* (2013.01); *B08B 7/00* (2013.01); *C23C 16/4405* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 5,326,723 A * | 7/1994 | Petro | ..................... | B08B 7/0035 |
| | | | | 134/1.2 |
| 5,679,215 A * | 10/1997 | Barnes | .............. | H01J 37/32862 |
| | | | | 134/1.1 |
| 6,767,836 B2 * | 7/2004 | San | ..................... | C23C 16/4405 |
| | | | | 134/1.1 |
| 8,591,659 B1 * | 11/2013 | Fang | ................. | H01J 37/32357 |
| | | | | 134/1.1 |
| 2007/0131245 A1 * | 6/2007 | Nakayama | ............ | B08B 7/0035 |
| | | | | 134/1.1 |
| 2011/0223710 A1 * | 9/2011 | Beck | ........................ | B08B 7/00 |
| | | | | 438/95 |
| 2014/0345644 A1 * | 11/2014 | Okabe | ............... | H01J 37/32862 |
| | | | | 134/1.1 |

* cited by examiner

*Primary Examiner* — Binh X Tran
*Assistant Examiner* — David Cathey, Jr.

(57) ABSTRACT

A method for operating a substrate processing chamber includes after performing a process using a fluorine-based gas in the substrate processing chamber: a) during a first predetermined period, supplying a gas mixture to the substrate processing chamber including one or more gases selected from a group consisting of molecular oxygen, molecular nitrogen, nitric oxide and nitrous oxide and supplying RF power to strike plasma in the substrate processing chamber; b) during a second predetermined period after the first predetermined period, supplying molecular hydrogen gas and RF power to the substrate processing chamber; c) repeating a) and b) one or more times; d) purging the substrate processing chamber with molecular nitrogen gas; e) increasing chamber pressure; f) evacuating the substrate processing chamber; and g) repeating d), e) and f) one or more times.

12 Claims, 4 Drawing Sheets

SYSTEMS AND METHODS FOR ELIMINATING FLOURINE RESIDUE IN A SUBSTRATE PROCESSING CHAMBER USING A PLASMA-BASED PROCESS

FIELD

The present disclosure relates to substrate processing systems, and more particularly to systems and methods for eliminating fluorine residue in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to ash or etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

Gas mixtures including fluorine may be used during substrate treatment such as ashing or etching processes. Gas mixtures including fluorine may also be used during cleaning processes for components located within the substrate processing chamber.

During either substrate treatment or chamber cleaning processes, fluorine containing gases (such as sulfur hexafluoride ($SF_6$), nitrogen trifluoride ($NF_3$) or carbon tetrafluoride ($CF_4$) are dissociated. Fluorine ions and radicals react with surfaces of the substrate and/or exposed surfaces in the substrate processing chamber. The fluorine ions and radicals attach to components within the substrate processing chamber. When the substrate processing chamber is subsequently opened and exposed to atmosphere, moisture in the air reacts with the fluorine ions and radicals and creates hydrofluoric (HF) acid.

An ambient air purge process may be used to mitigate the effects of the HF acid that is created when the substrate processing chamber is opened. During this process, the substrate processing chamber is maintained at a constant vacuum pressure and ambient air is introduced. The ambient air contains water, which reacts with fluorine ions and radicals on the components of the processing chamber. The reaction creates gaseous HF, which is then pumped away and treated by a scrubber.

SUMMARY

A method is disclosed for operating a substrate processing chamber. The method is performed after a process using a fluorine-based gas in the substrate processing chamber. The method includes a) supplying a gas mixture to the substrate processing chamber including one or more gases selected from a group consisting of molecular oxygen, molecular nitrogen, nitric oxide and nitrous oxide and supplying RF power to strike plasma in the substrate processing chamber during a first predetermined period; b) supplying molecular hydrogen gas and RF power to the substrate processing chamber during a second predetermined period after the first predetermined period; c) repeating a) and b) one or more times; d) purging the substrate processing chamber with molecular nitrogen gas; e) increasing chamber pressure; f) evacuating the substrate processing chamber; and g) repeating d), e) and f) one or more times.

In other features, the method includes setting a pressure in the substrate processing chamber to a first predetermined pressure during a). The first predetermined pressure is in a range from 400 mTorr to 3 Torr.

In other features, the method includes setting the pressure in the substrate processing chamber to a second predetermined pressure during b). The second predetermined pressure is in a range from 400 mTorr and 3 Torr.

In other features, the method includes setting the pressure in the substrate processing chamber to a third predetermined pressure during c). The third predetermined pressure is in a range from 5 Torr and 15 Torr.

In other features, the RF power in a) is in a range from 500 W to 2 kW. The method includes supplying an RF bias to a substrate support arranged in the substrate processing chamber. The RF bias is in a power range from 100 W to 500 W. The one or more gases are supplied at a flow rate between 100 and 5000 sccm. The molecular hydrogen is supplied at a flow rate between 500 and 3000 sccm.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure eliminate the possibility of HF acid in the substrate processing chamber after processes using fluorine gas by eliminating exposure to ambient air during post processing. As discussed above, the ambient air purge process introduces ambient air, which can cause HF acid contamination. In addition, the ambient air purge processes introduce moisture into the substrate processing chamber. The moisture may remain in the substrate processing chamber after performing maintenance activity and can cause a variety of issues including particles, contamination, process drift, etc. The systems and methods according to the present disclosure eliminate the need for the ambient air purge process, which eliminates the associated productivity issues.

Figure 1:
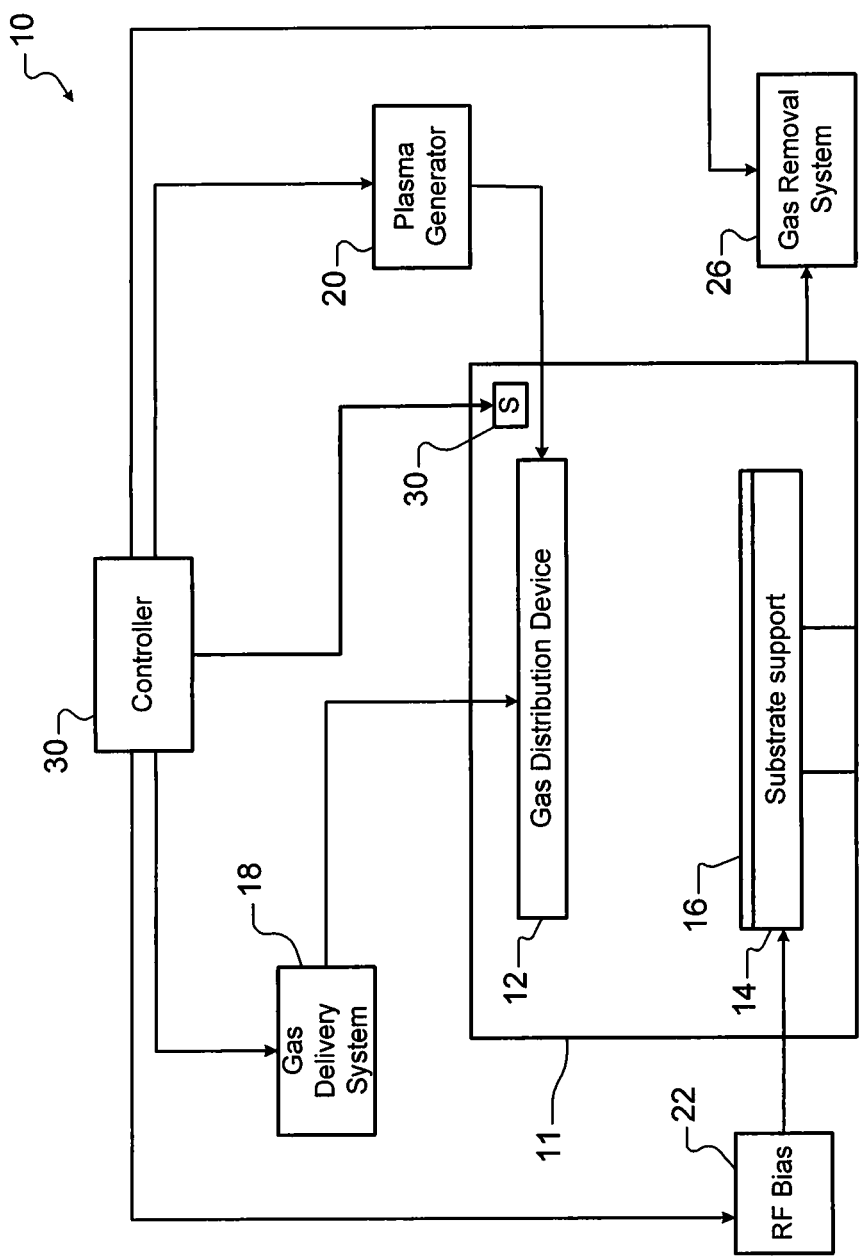
FIG. 1 is a functional block diagram of an example of a substrate processing system according to the present disclosure.

Referring now to FIG. 1, an example of a substrate processing chamber 10 according to the present disclosure is shown. While a specific substrate processing chamber 10 is shown and described, the methods described herein may be implemented using other types of substrate processing systems. The substrate processing chamber 10 includes a chamber enclosure 11. A gas distribution device 12 distributes gas in the chamber enclosure 11. In some examples, the gas distribution device 12 includes a showerhead, although other gas distribution devices may be used. A substrate support 14 such as a plate, pedestal, electrostatic chuck, etc. is also arranged in the chamber enclosure 11. During substrate processing such as deposition or etching, a substrate 16 is arranged on the substrate support 14. The substrate 16 may be removed from the chamber enclosure 11 during cleaning processes.

A gas delivery system 18 supplies one or more process gas mixtures, purge gas mixtures, cleaning gas mixtures, or individual gases to the gas distribution device 12. In some examples, the gas mixtures include a fluorine-based gas. A plasma generator 20 selectively supplies RF power to create plasma. The RF power may be output to one of the gas distribution device 12 or the substrate support 14. In some examples, the other one of the gas distribution device 12 or the substrate support 14 is connected to a reference potential such as ground. An RF bias generator 22 selectively supplies an RF bias to the substrate support 14.

A gas removal system 26 selectively evacuates reactants from the chamber enclosure 11 and/or controls pressure within the chamber enclosure 11. One or more sensors 28 may be arranged in the chamber to sense chamber parameters such as temperature, pressure, etc. A controller 30 may be connected to the gas delivery system 18, the plasma generator 20, the RF bias generator 22, the gas removal system 26 and/or the sensor 28.

Figure 2:
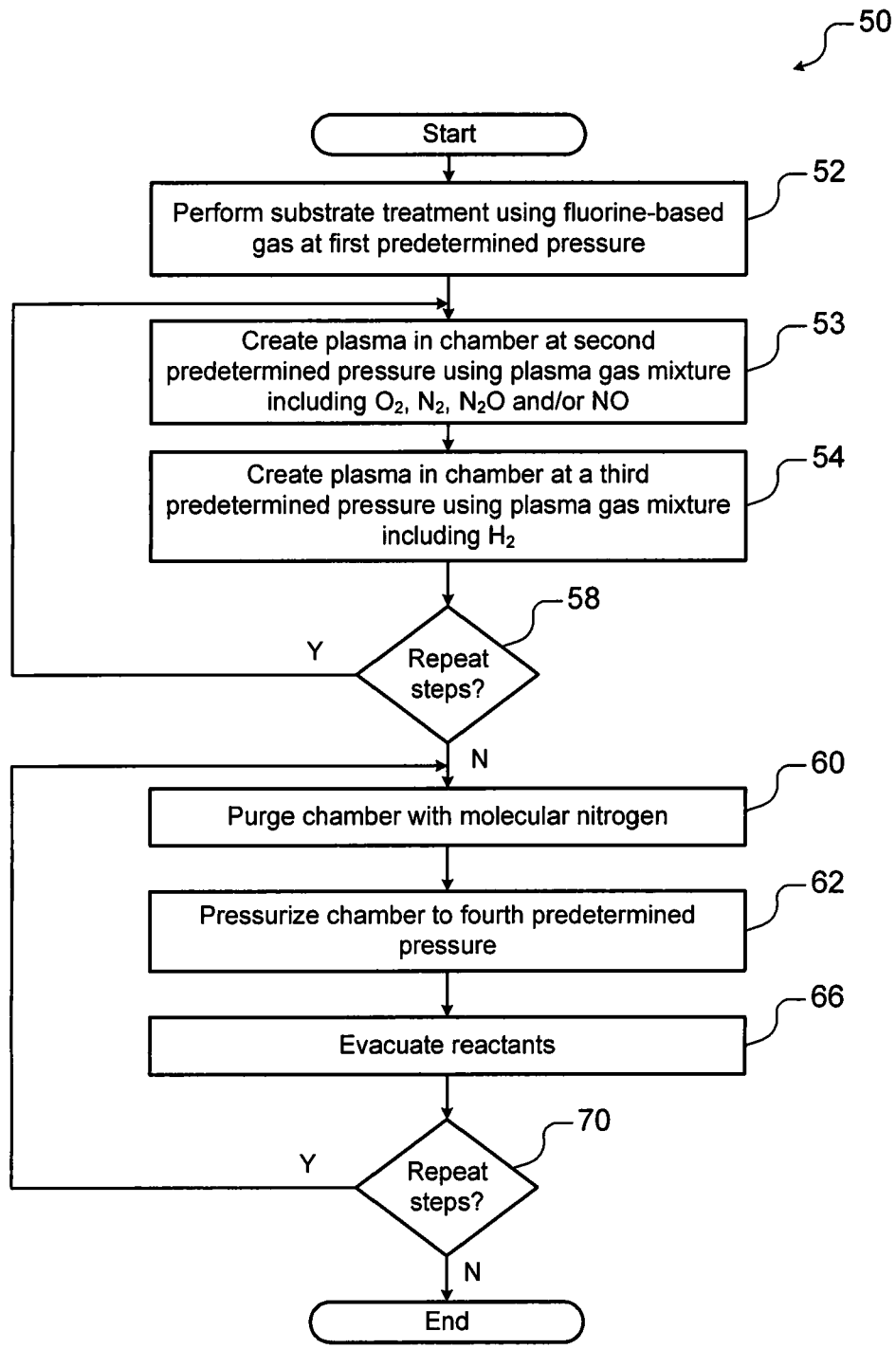
FIG. 2 is a flowchart illustrating an example of a method for eliminating fluorine from components in a substrate processing chamber after cleaning or substrate treatment processes using fluorine gas.

Referring now to FIG. 2, a method 50 for eliminating fluorine in the chamber enclosure 11 is shown. At 52, substrate treatment or chamber cleaning process is performed in the substrate processing chamber using a fluorine-based gas at a first predetermined pressure. In some examples, the fluorine-based process involves ashing, etching, cleaning or any other process that leaves fluorine residue. In some examples, the first predetermined pressure is in a pressure range between 400 mTorr and 3 Torr. In some examples, the first predetermined pressure is in a pressure range between 1.5 Torr and 3 Torr. In some examples, the chamber may be purged prior to initiating the process.

At 53, plasma is created in the substrate processing chamber at a second predetermined pressure for a predetermined period using a plasma gas mixture including one or more gases selected from the group consisting of molecular oxygen ($O_2$), nitric oxide (NO), nitrous oxide ($N_2O$), and molecular nitrogen ($N_2$). In some examples, flow rates of the one or more gases are between 100 and 5000 sccm. In some examples, the predetermined period is between 200 s and 400 s. In some examples, the predetermined period is around 300 s+/−25 s.

In some examples, the second predetermined pressure is less than the first predetermined pressure. In some examples, the second predetermined pressure is in a pressure range between 400 mTorr and 3 Torr. In some examples, the second predetermined pressure is in a pressure range between 400 mTorr and 1 Torr. In some examples, the second predetermined pressure is 800 mTorr+/−50 mTorr. In some examples, RF power between 500 Watts and 2 kW is provided. In some examples, RF bias power in a range from 100 to 500 Watts is supplied to the substrate support.

At 54, plasma is created in the chamber at a third predetermined pressure for a predetermined period using a plasma gas mixture including molecular hydrogen ($H_2$). In some examples, the predetermined period is between 200 s and 400 s. In some examples, the predetermined period is 300 s+/−25 s. In some examples, the third predetermined pressure is in a pressure range between 400 mTorr and 3 Torr. In some examples, the third predetermined pressure is 800 mTorr+/−50 mTorr. In some examples, RF power between 500 Watts and 2 kW is provided. In some examples, RF bias power in a range from 100 to 500 Watts is supplied to the substrate support. In some examples, a flow rate of the $H_2$ is between 500 and 3000 sccm.

At 58, steps 53 and 54 may be repeated zero, one or more times. In some examples, the steps 53 and 54 are repeated 5 to 15 times. In some examples, the steps 53 and 54 are repeated 10 times+/−2 times. When 58 is false, the method proceeds at 60 by purging the chamber with molecular nitrogen ($N_2$). At 62, the chamber is pressurized to a fourth predetermined pressure. In some examples, the fourth predetermined pressure is in a pressure range between 5 Torr and 15 Torr. In some examples, the fourth predetermined pressure is 10 Torr+/−2 Torr.

At 66, the reactants are evacuated from the substrate processing chamber. At 70, steps 60, 62 and 66 may be repeated zero, one or more times. In some examples, the steps 60, 62 and 66 are repeated 30 to 70 times. In some examples, the steps 53 and 54 are repeated 50 times+/−5 times.

Figure 3:
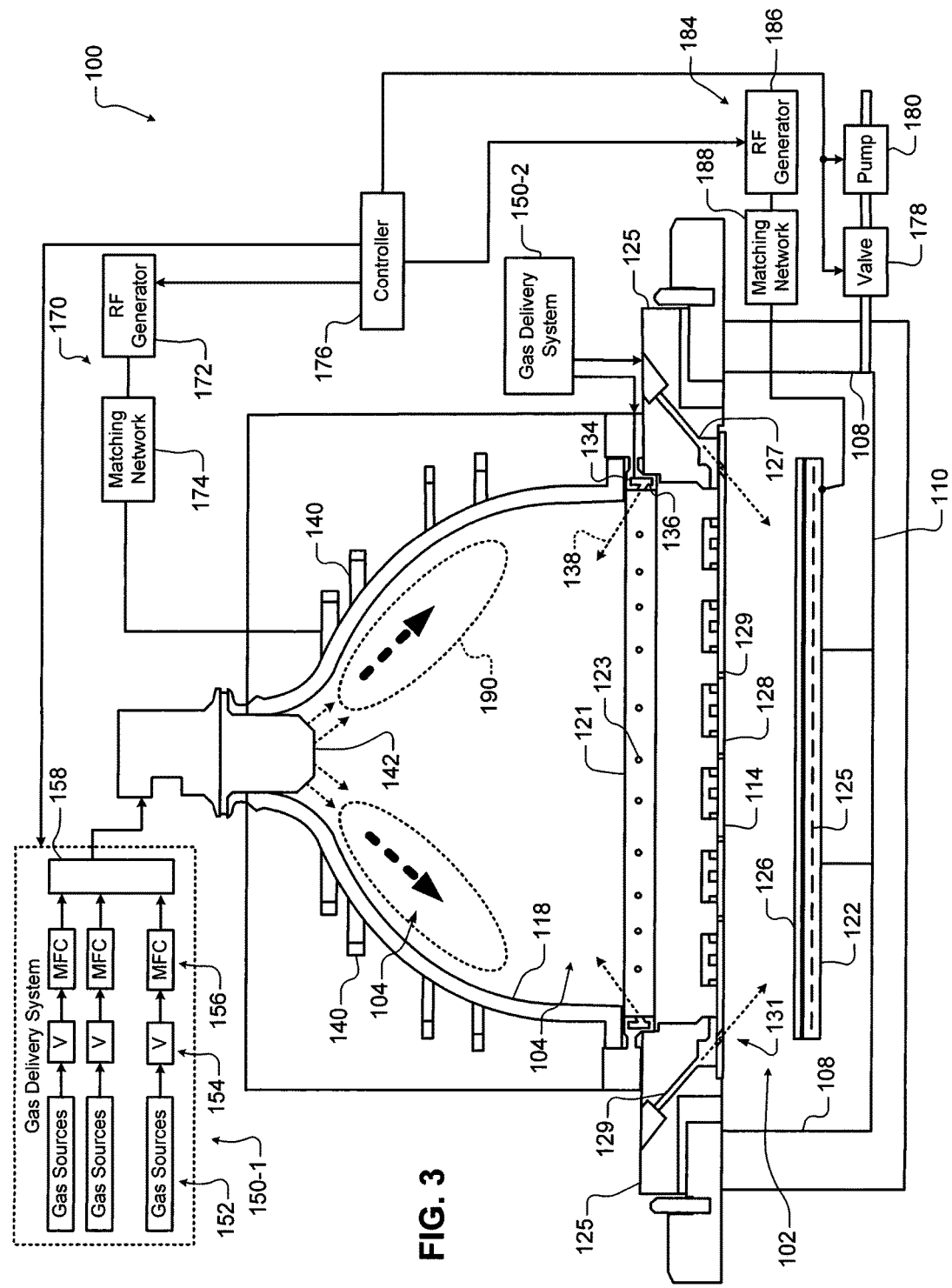
FIG. 3 is a functional block diagram of another example of a substrate processing system according to the present disclosure.

Referring now to FIG. 3, an example of a substrate processing chamber 100 according to the present disclosure is shown. While another specific substrate processing chamber is shown and described, the methods described herein may be implemented using other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 104. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 125, an optional cooling plate with fluid channels and one or more sensors (not shown); although any other suitable temperature control system may be used.

In some examples, the gas distribution device 114 includes a showerhead (for example, a plate 128 having a plurality of spaced holes 129). The plurality of spaced holes 129 extend from the upper surface of the plate 128 to the lower surface of the plate 128. In some examples, the spaced holes 129 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

In some examples, an RF bias is supplied. RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

Figure 4:
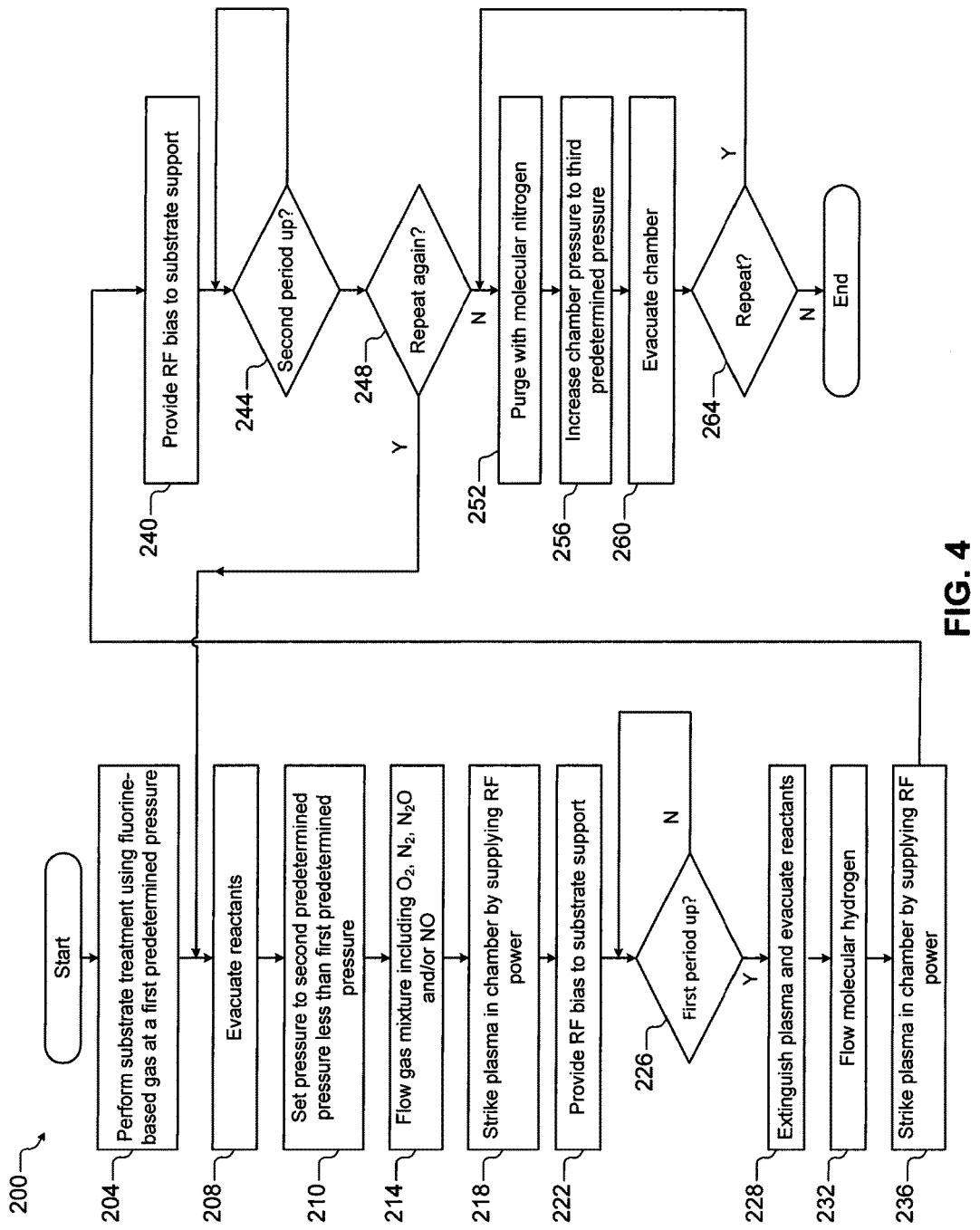
FIG. 4 is a flowchart illustrating another example of a method for eliminating fluorine from components in a substrate processing chamber after cleaning or substrate treatment processes using fluorine gas.

Referring now to FIG. 4, a method 200 for eliminating fluorine from the substrate processing chamber is shown. At 204, substrate treatment (such as ashing, etching or cleaning) using fluorine-based gas is performed at a first predetermined pressure. At 208, reactants are evacuated from the substrate processing chamber. At 210, the pressure is set to a second predetermined pressure. In some examples, the second predetermined pressure is less than the first predetermined pressure. At 214, a gas mixture including one or more gases selected from a group consisting of $O_2$, $N_2$, NO and $N_2O$ is supplied to the substrate processing chamber.

At 218, RF power is supplied and plasma is struck in the substrate processing chamber. At 222, an RF bias is optionally supplied to the substrate support. At 226, the method determines whether a first predetermined period is up. When 226 is true, the method continues at 228 and extinguishes the plasma and evacuates reactants from the substrate processing chamber.

At 232, the gas delivery system supplies molecular hydrogen ($H_2$) to the substrate processing chamber and plasma is struck in the substrate processing chamber. At 240, an RF bias is optionally supplied to the substrate support. At 244, method determines whether a second predetermined period is up. When 244 is true, the method continues with 248 and selectively repeats the process between steps 208 and 240 (zero, one or more times). When 248 is false, the method continues at 252. The substrate processing chamber is purged with molecular nitrogen ($N_2$). At 256, chamber pressure is increased to a third predetermined pressure. At 260, the chamber is evacuated. At 260, the method determines whether or not to repeat steps 252 through 260 (zero, one or more times). In some examples, the RF power levels, RF bias levels, flow rates and process times of FIG. 2 are used.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A method for operating a substrate processing chamber, comprising:
   after performing a process using a fluorine-based gas in the substrate processing chamber:
      a) during a first predetermined period, supplying a gas mixture to the substrate processing chamber including one or more gases selected from the group consisting of molecular oxygen, molecular nitrogen, nitric oxide and nitrous oxide and supplying RF power to strike plasma in the substrate processing chamber;
      b) during a second predetermined period after the first predetermined period, supplying molecular hydrogen gas and RF power to the substrate processing chamber;
      c) repeating a) and b) one or more times;
      d) purging the substrate processing chamber with molecular nitrogen gas;
      e) increasing chamber pressure;
      f) evacuating the substrate processing chamber; and
      g) repeating d), e) and f) one or more times.
2. The method of claim 1, further comprising setting a pressure in the substrate processing chamber to a first predetermined pressure during a).
3. The method of claim 2 wherein the first predetermined pressure is in a range from 400 mTorr to 3 Torr.
4. The method of claim 2, further comprising setting the pressure in the substrate processing chamber to a second predetermined pressure during b).
5. The method of claim 4, wherein the second predetermined pressure is in a range from 400 mTorr and 3 Torr.
6. The method of claim 4, further comprising setting the pressure in the substrate processing chamber to a third predetermined pressure during c).
7. The method of claim 6, wherein the third predetermined pressure is in a range from 5 Torr and 15 Torr.

8. The method of claim 1, wherein the RF power in a) is in a range from 500 W to 2 kW.

9. The method of claim 1, further comprising supplying an RF bias to a substrate support arranged in the substrate processing chamber.

10. The method of claim 9, wherein the RF bias is in a power range from 100 W to 500 W.

11. The method of claim 1, wherein the one or more gases are supplied at a flow rate between 100 and 5000 sccm.

12. The method of claim 1, wherein the molecular hydrogen is supplied at a flow rate between 500 and 3000 sccm.

* * * * *